United States Patent [19]
Shendon et al.

[11] Patent Number: 6,120,608
[45] Date of Patent: Sep. 19, 2000

[54] WORKPIECE SUPPORT PLATEN FOR SEMICONDUCTOR PROCESS CHAMBER

[75] Inventors: Norman Shendon, San Carlos; James S. Papanu, San Rafael; David Palagashvili, Mountain View, all of Calif.

[73] Assignee: Applied Materials, Inc., Santa Clara, Calif.

[21] Appl. No.: 08/816,629

[22] Filed: Mar. 13, 1997

[51] Int. Cl.$^7$ .............................. C23C 16/00; C23C 14/00
[52] U.S. Cl. ............................ 118/728; 118/50; 118/724; 118/725; 118/729
[58] Field of Search .................................. 118/728, 729, 118/50, 724, 725

[56] References Cited

U.S. PATENT DOCUMENTS

| | | | |
|---|---|---|---|
| 5,137,610 | 8/1992 | Shumate et al. | 204/192.32 |
| 5,215,619 | 6/1993 | Cheng et al. | 156/345 |
| 5,225,024 | 7/1993 | Hanley et al. | 156/345 |
| 5,304,248 | 4/1994 | Cheng et al. | 118/728 |
| 5,366,585 | 11/1994 | Robertson et al. | 156/643 |
| 5,484,485 | 1/1996 | Chapman | 118/723 R |
| 5,695,568 | 12/1997 | Sinha et al. | 118/729 |

FOREIGN PATENT DOCUMENTS 3-291928  12/1991  Japan ........................ H01L 21/302

*Primary Examiner*—Shrive Beck
*Assistant Examiner*—Norca L. Torres
*Attorney, Agent, or Firm*—Robert Stern

[57] ABSTRACT

Apparatus and method for mounting a workpiece support platform or platen within a semiconductor process vacuum chamber to provide electrical or thermal insulation and mechanical stability, but yet minimize mechanical stresses due to differential thermal expansion between the platen and the dielectric spacer. Specifically, the invention includes a workpiece support platen having a rear surface abutting a front surface of a platen-support shelf. The shelf preferably provides electrical or thermal insulation between the platen and the wall of the vacuum chamber. The shelf is attached to the enclosure of the vacuum chamber, but the platen is not rigidly attached to the shelf. Instead, a pressure actuator, such as a spring or pneumatic piston, presses the platen against the shelf. In one embodiment, the pressure actuator can be turned off to allow the platen to expand or contract during periods of heating or cooling, such as when the chamber is turned off or on before or after maintenance. When the temperature of the platen is stable during processing of semiconductor workpieces, the pressure actuator can be turned on to hold the platen firmly in position against the shelf. In a second embodiment, the pressure actuator is adjusted to apply a pressure high enough to inhibit inadvertent movement of the platen, yet low enough to accommodate differential thermal expansion between the platen and the shelf by the platen sliding across the front surface of the shelf, thereby minimizing mechanical stresses between the platen and the shelf.

32 Claims, 4 Drawing Sheets

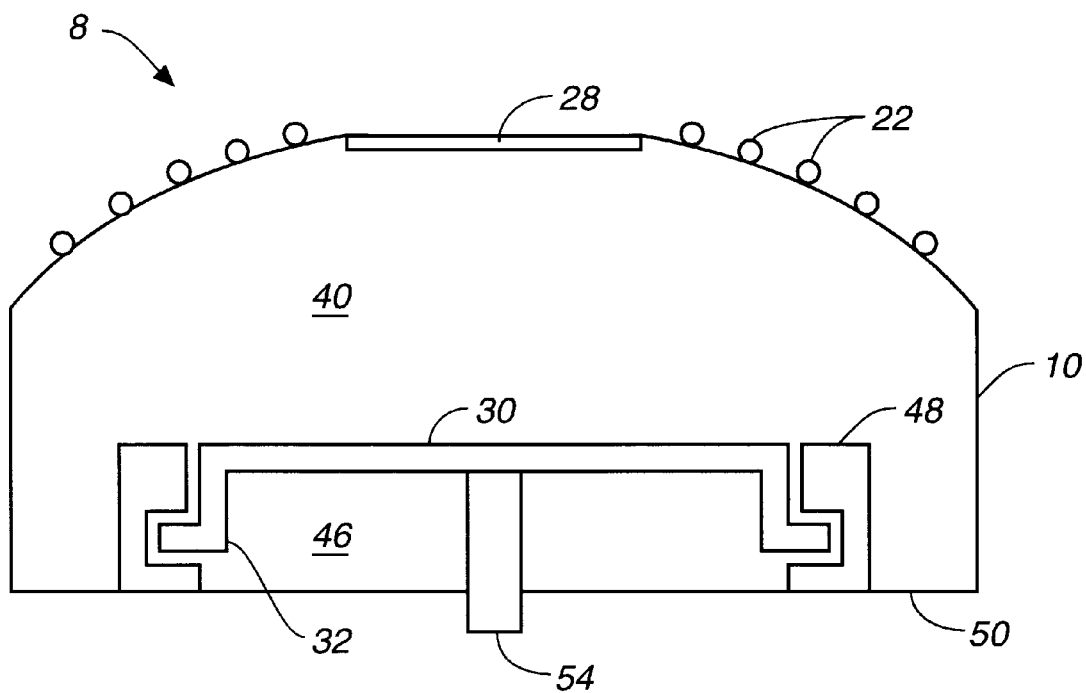
FIG._1

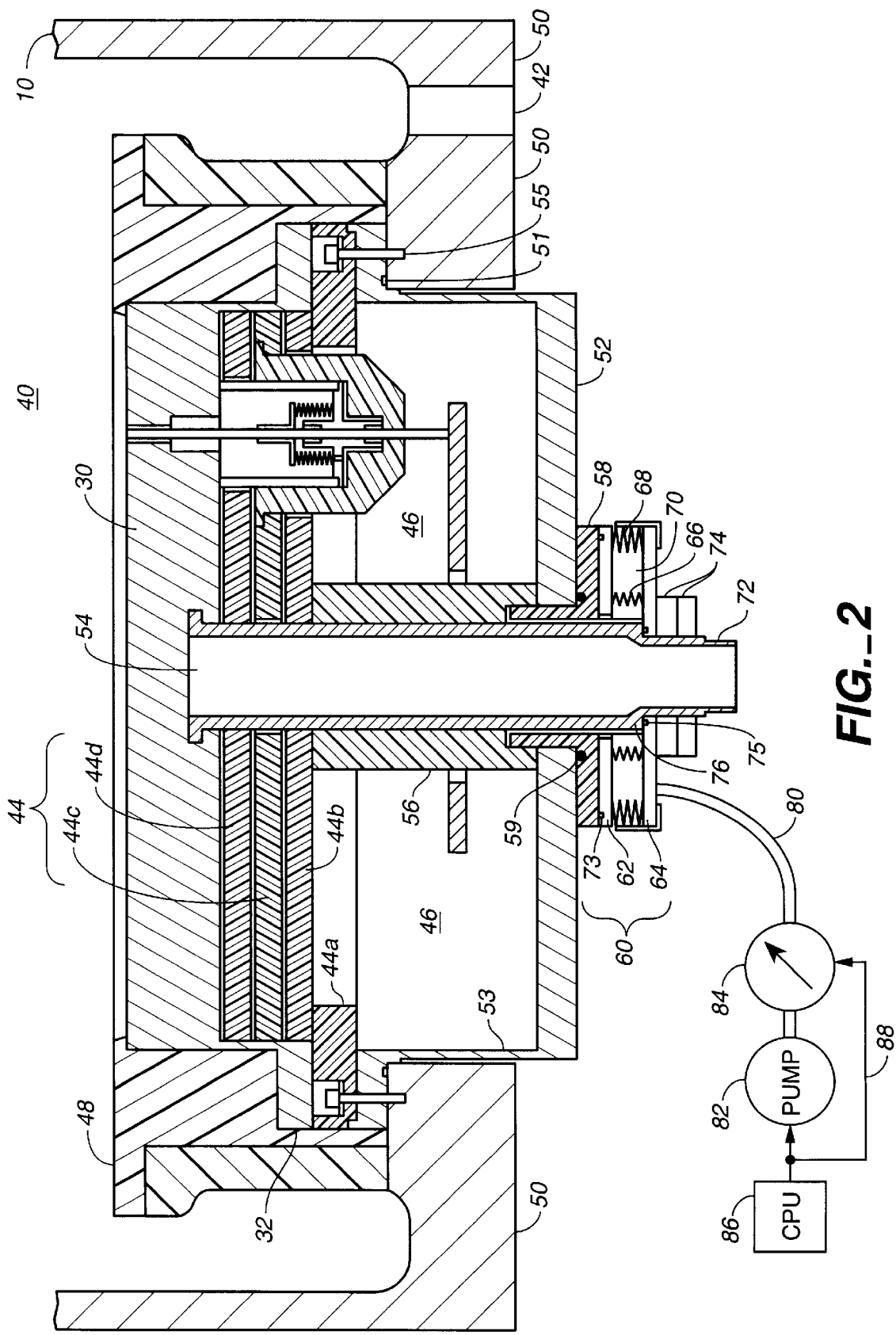
FIG._2

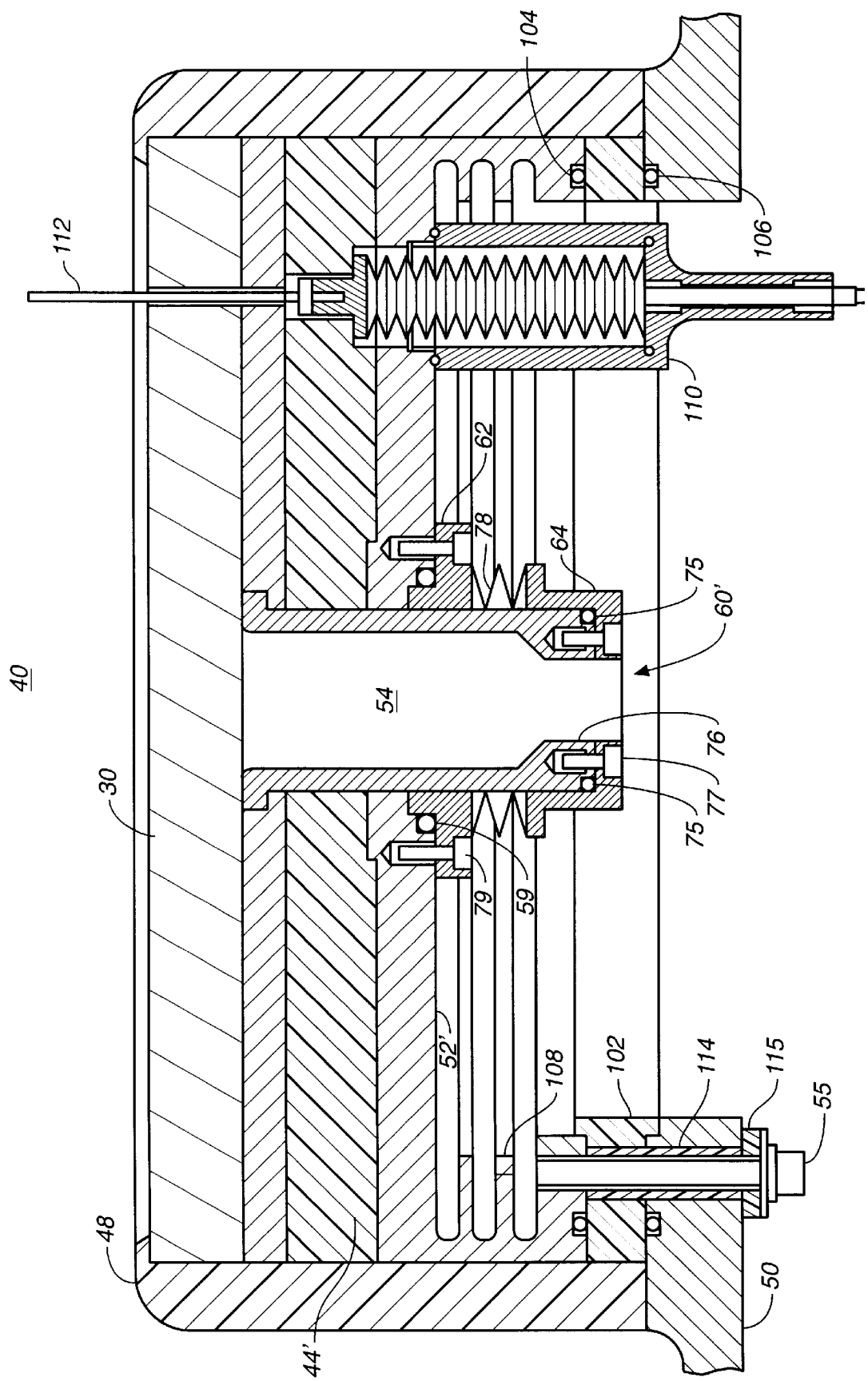
FIG._3

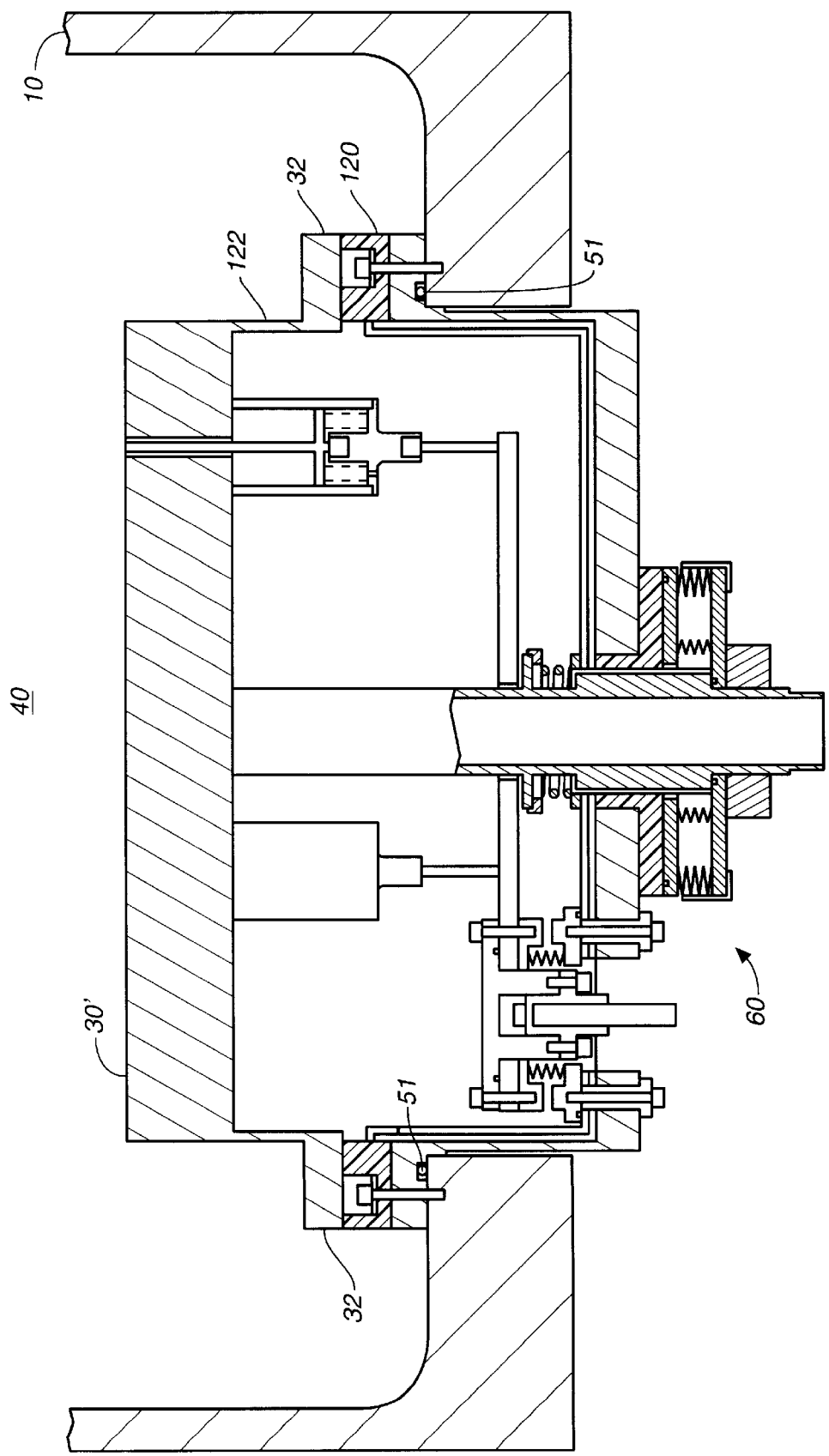
FIG._4

WORKPIECE SUPPORT PLATEN FOR SEMICONDUCTOR PROCESS CHAMBER

FIELD OF THE INVENTION

The invention relates generally to a platen or pedestal for supporting a semiconductor substrate or other workpiece within a vacuum chamber for semiconductor processing. More specifically, the invention relates to a method and apparatus for mounting the platen so as to inhibit unintended movement, yet permit differential thermal expansion between the platen and other chamber components with minimal stress even at high platen temperatures.

BACKGROUND OF THE INVENTION

A conventional semiconductor process vacuum chamber typically includes a vacuum-tight chamber enclosure made of aluminum within which is mounted an aluminum platform or platen which supports a semiconductor wafer or other workpiece. For semiconductor fabrication processes such as etching or chemical vapor deposition, process gases are pumped into the chamber. Typically, the process gases are decomposed into reactive ions by a thermal or electrical energy source, most typically by employing a source of radio frequency (RF) power to excite some or all of the process gases into a plasma state.

Many semiconductor process chambers require the metal platen to be electrically and thermally insulated from the metal chamber wall. Electrical insulation typically is required because the platen is electrically powered by an RF power supply to create a desired voltage differential between the plasma body and the platen, which, in such cases, is also called the cathode. Thermal insulation typically is required because semiconductor processing generally requires maintaining the workpiece at a regulated high temperature, but it is desirable to minimize heating of the chamber wall and other chamber components.

Electrical and thermal insulation between the platen and the chamber wall conventionally is accomplished by either mounting the platen on a post which holds the platen a fixed distance from the chamber wall, or else by mounting a dielectric spacer between the platen and the chamber wall. Both approaches typically leave gaps between the platen and either the chamber wall or dielectric spacer. The process gases used for the semiconductor fabrication processes can enter these gaps and create undesirable deposits. The deposits must be removed periodically by cleaning or replacing the affected components. If the deposits are not removed, they can flake off in the form of particles which can settle on the wafer, thereby ruining at least a portion of the semiconductor circuitry being fabricated.

Some conventional semiconductor process chambers include a dielectric shield encircling the perimeter of the platen. However, such shields typically leave a gap between the shield and the platen through which process gases can enter and create deposits. Mounting the shield and platen tightly together typically is impractical because the platen expands and contracts in response to temperature changes. Specifically, the platen expands when it is raised to normal wafer processing temperatures, and it contracts when the chamber is turned off and opened for maintenance. In contrast, the dielectric shield generally is composed of alumina or other ceramic having a very low thermal expansion coefficient. For example, a 12.5-inch aluminum platen designed to support a 12-inch semiconductor wafer typically will expand 0.1 inch when its temperature is raised from 25° C. to 400° C., whereas any expansion of the ceramic shield typically will be negligible. If the shield and platen were rigidly attached to seal out process gases, mechanical stress due to differential thermal expansion could crack the dielectric shield. The thermal stress problem increases if larger platens are used to process larger diameter semiconductor wafers.

Therefore, there is a need for an improved system for mounting a cathode in a semiconductor process chamber which allows the platen to be electrically or thermally insulated from the chamber wall, and which minimizes mechanical stress due to differential thermal expansion, without requiring gaps behind the platen in which process gases can create undesirable deposits.

SUMMARY OF THE INVENTION

The present invention is an apparatus and method for mounting a workpiece support platform or platen within a semiconductor process vacuum chamber so as to provide electrical or thermal insulation and good mechanical stability, but yet minimize mechanical stresses due to differential thermal expansion between the workpiece support platform and the dielectric spacer.

Specifically, the invention includes a workpiece support platform or platen having a rear (or lower) surface which abuts (and preferably rests on) a front (or upper) surface of a platen-support shelf. The shelf preferably provides electrical or thermal insulation between the platen and the wall of the vacuum chamber. The shelf is attached to the enclosure of the vacuum chamber, but the platen is not rigidly attached to the shelf. Instead, a pressure actuator, such as a spring or pneumatic piston, presses the platen against the shelf.

In one aspect of the invention, the pressure actuator can be turned off to allow the platen to expand or contract during periods of heating or cooling, such as when the chamber is turned off or on before or after maintenance. When the temperature of the platen is stable during processing of semiconductor workpieces, the pressure actuator can be turned on to hold the platen firmly in position against the shelf.

In a second aspect of the invention, the pressure actuator is adjusted to apply a pressure high enough to inhibit inadvertent movement of the platen, yet low enough to accommodate differential thermal expansion between the platen and the shelf by the platen sliding across the front surface of the shelf, thereby minimizing mechanical stresses between the platen and the shelf.

Preferably, the workpiece support platform or platen is a metal electrode, such as an aluminum cathode, for supporting a semiconductor wafer.

BRIEF DESCRIPTION OF THE DRAWINGS

FIG. 1 is a sectional, partially schematic, view of a semiconductor process vacuum chamber having a pressure actuator to retain the platen in accordance with the present invention.

FIG. 2 is an expanded sectional view of the lower portion of the chamber shown in FIG. 1.

FIG. 3 is a sectional view of an alternative embodiment of the invention in which the insulator shelf rests on the chamber's rear cover.

FIG. 4 is a sectional view of another alternative embodiment in which the insulator shelf is a ring.

DETAILED DESCRIPTION OF THE PREFERRED EMBODIMENTS

1. Process Chamber Overview

FIGS. 1 and 2 show a semiconductor process vacuum chamber 8 according to a first embodiment of the present invention. As shown in FIG. 1, the chamber includes a conventional cylindrical aluminum enclosure 10 which houses a disc-shaped (i.e., cylindrical) aluminum platen 30 for supporting a semiconductor wafer (not shown). Unlike a conventional platen, the platen used in this embodiment has a peripheral flange 32 extending rearward of the platen for purposes to be described below.

The illustrated chamber includes an inductive plasma source consisting of an electrical coil 22 wound around a quartz dome 24 which covers the top of the chamber. Process gases are pumped into the source region through a perforated gas inlet plate 28. RF power applied to the coil 22 excites the process gases into a plasma state so that the process gas molecules dissociate into reactive ions. Many of the reactive ions travel out of the plasma and into the central region 40 of the chamber between the source region and the platen.

RF power also is applied to the platen 30, thereby producing a negative DC bias voltage on the wafer relative to the electrically grounded chamber enclosure 10. The negative bias attracts reactive ions toward the wafer. Upon contact with the wafer, the ions effect a desired wafer fabrication process such as etching or deposition, depending on the process gases chosen.

An exhaust pump (not shown) maintains a desired level of vacuum in the chamber 8 and exhausts reaction products through one or more exhaust ports 42.

As shown in FIG. 2, the rear (lower) surface of the cathode or platen 30 rests on the front (upper) surface of an insulator shelf assembly 44. The insulator shelf 44 performs four functions: (1) it supports the weight of the platen 30; (2) it electrically insulates the RF-powered cathode or platen 30 from the electrically grounded chamber wall 10, 50; (3) it thermally insulates the platen from the chamber wall 10, 50; and (4) it obstructs process gas molecules and ions in the central region 40 of the chamber from entering the region 46 behind the platen.

The platen is surrounded by a dielectric outer shield 48 to prevent arcing or other electrical discharge between the platen and the adjacent surface of the chamber enclosure 10. As will be explained below, the outer shield also helps obstruct process gas molecules and ions in the central region 40 of the chamber from entering the region 46 behind the platen.

The insulator material of which the shelf assembly 44 and the outer shield 48 are fabricated preferably is a good electrical and thermal insulator, the currently preferred material being the ceramic alumina. All other insulator or dielectric components described below also are preferably alumina unless stated otherwise.

The rear wall 50 of the chamber enclosure has a large, circular opening permitting maintenance access to the components behind the platen. During operation of the chamber, the opening is sealed by a stainless steel rear cover 52. An O-ring 51 between the rear cover 52 and the chamber rear wall 50 provides a vacuum seal between the ambient atmosphere below the rear cover and the vacuum within the process chamber 8. A plurality of bolts 55 spaced around the periphery of the rear cover 52 fasten the rear cover to the rear wall 50 of the process chamber while compressing the O-ring 51.

A pedestal or post 54 made of metal (typically aluminum or stainless steel) provides the electrical connection between the platen 30 and electrical power supplies located outside the process chamber 8. In the preferred embodiment, the pedestal 54 connects to an RF power supply and to a DC voltage source for electrostatically chucking a wafer to the platen. The pedestal or post 54 may be hollow to function as an enclosure for additional electrical cables and fluid conduits which connect the platen 30 to apparatus outside the process chamber. For example, in the preferred embodiment the pedestal 54 encloses a pair of wires for connecting a resistive heating element embedded in the platen to a low voltage, high current power supply. In addition, the pedestal 54 encloses a gas conduit connecting a network of gas passages within the platen to a pump which supplies helium gas to enhance heat transfer between the platen and a wafer supported thereon.

The forward (upper) end of the pedestal 54 is attached to the center of the platen by brazing. The rear (i.e., lower) end of the pedestal extends through a circular aperture in the center of the rear cover 52.

Because the pedestal 54 carries RF power, it is surrounded by a cylindrical dielectric sleeve 56, to prevent arcing or other electrical discharge between the pedestal and adjacent metal components. For the same reason, an annular dielectric flange 58 surrounds the pedestal where it passes through the aperture in the rear cover 52. An O-ring 59 provides a vacuum seal between the dielectric flange 58 and the rear cover, because the region behind the rear cover is at atmospheric pressure.

2. Pressure Actuator to Hold Platen a. Overview

In the present invention, in contrast with many conventional designs, the pedestal or post 54 is not rigidly attached to the chamber rear (lower) wall 50, to the rear (lower) cover 52, or to the insulator shelf assembly 44. The annular dielectric flange 58 and dielectric sleeve 56 keep the platen centered above the central aperture of the rear cover 52, but they do not constrain the platen from rotation or radial expansion. Instead, movement of the platen is constrained by a pressure actuator 60 which pushes the pedestal 54 rearward, thereby pressing the rear (lower) surface of the platen 30 against the front (upper) surface of the shelf assembly 44. The insulator shelf assembly is rigidly attached to the chamber wall 10, and the pressure between the rear surface of the platen 30 and the front surface of the shelf 44 creates sufficient friction to prevent inadvertent movement of the platen.

During any processing of a semiconductor wafer, the pressure actuator should apply sufficient pressure between the platen and the inner shield assembly to prevent inadvertent movement of the platen. Preferably, however, the pressure applied should be low enough that friction between the platen and the underlying surface of the insulator shelf 44 is low enough to permit the platen to expand and contract radially in response to the range of temperature changes to which the platen will be exposed during semiconductor wafer processing. In a pneumatically controlled embodiment of the pressure actuator, described immediately below, the pressure actuator also can be adjusted to reduce or eliminate the pressure between the platen and the insulator shelf during periods when the platen is heating up or cooling down, thereby minimizing mechanical stress from thermal expansion of the platen relative to the insulator shelf.

b. Pneumatic Pressure Actuator

FIG. 2 shows a pneumatically controlled pressure actuator 60. Upper and lower annular plates 62 and 64 respectively constitute the upper and lower enclosures of the pressure actuator. The upper and lower plates are spaced apart by concentric inner and outer bellows 66 and 68, respectively. The upper and lower ends of both bellows are sealingly attached to the upper and lower plates, preferably by welding, so as to form an air-tight cavity or actuator chamber 70 in the annular region bounded by the two bellows 66, 68 and the two annular plates 62, 64.

In the preferred embodiment, the two annular plates 62 and 64 are composed of stainless steel. The two bellows 66 and 68 are composed of a flexible material capable of withstanding a temperature close to the highest processing temperature of the semiconductor wafers, since the annular plates directly contact the pedestal 54, which in turn directly contacts the hot platen 30. Examples of suitable materials for the bellows are pleated sheets of stainless steel or inconel alloy. Such materials conventionally are used in various bellows in semiconductor process vacuum chambers, such as the bellows commonly used in wafer lift mechanisms.

The rear (lower) end 72 of the pedestal 54 is threaded and has a smaller diameter than the remaining forward or upper portion of the pedestal. The lower annular plate 64 has a diameter between the respective diameters of the lower end and the upper portion of the pedestal. One or two threaded nuts 74 tightly secure the lower annular plate 64 against the lower shoulder 76 of upper portion of the pedestal 54.

One O-ring 73 provides a vacuum seal between the upper annular plate 62 and the dielectric flange 58. Another O-ring 75 provides a vacuum seal between the lower annular plate 64 and the lower shoulder 76 of the larger diameter upper portion of the pedestal 54.

A fitting (not shown) on the lower annular plate 64 permits attachment of a pneumatic conduit 80 connected to an external air pump 82, so that the air pump supplies pressurized air to the interior of the air-tight actuator chamber 70. A pressure regulator 84 on the air pump controls the air pressure inside the actuator chamber. A conventional microcomputer or CPU 86 preferably connects to the pump and regulator via an electrical bus 88, so that the microcomputer can control the air pressure in response to commands from a human operator or in response to programmed steps for processing a semiconductor workpiece in the chamber.

The inner diameter of the upper annular plate 62 is large enough for the annular plate to slide freely along the axis of the pedestal 54. Consequently, when the external air pump pressurizes the air inside the actuator chamber 70 to a pressure greater than the ambient atmospheric pressure outside the actuator 60, the actuator will apply an expansion force between the dielectric flange 58 on the rear of the process chamber and the nuts 74 attached to the pedestal 54. This pressure will force the platen 30 downward against the insulator shelf 44.

However, during times when a vacuum is maintained within the process chamber 8, the pressure difference between the front surface of the platen (at vacuum) and the rear surface of the lower annular plate 64 (at atmospheric pressure) will apply an upward force to the platen, tending to push it away from the insulator shelf 44. The resultant downward force on the platen will be the combined weight of the platen and pedestal, plus the downward force applied by the actuator, minus the upward force due to the vacuum in the process chamber.

As stated earlier, the pressure regulator 84 should be adjusted to supply an air pressure to the actuator chamber 70 which is high enough to press the platen against the insulator shelf with a force sufficient to prevent rotation or other inadvertent movement of the platen. However, the pressure preferably should be low enough that friction between the platen and the underlying surface of the insulator shelf 44 is low enough to permit the platen to expand and contract radially in response to the range of temperature changes to which the platen will be exposed during semiconductor wafer processing.

To design the pressure actuator, first the desired resultant downward force of the platen against the inner shield assembly should be chosen according to the criteria defined in the preceding paragraph. Next, the force which the pressure actuator 60 must produce to achieve the desired resultant downward force should be calculated as follows: The required actuator force equals the desired downward force on the platen, plus the upward force on the platen due to process chamber vacuum, minus the combined weight of the platen and pedestal. Finally, the amount by which the air pressure within the actuator chamber must be increased above atmospheric pressure should be calculated by multiplying the required actuator force by the surface area of the portion of the lower annular plate between the inner and outer bellows.

During time periods when the platen is heating up or cooling down, the computer 86 preferably controls the pump 82 and pressure regulator 84 to reduce the air pressure in the actuator chamber 70, thereby reducing the friction between the platen 30 and the insulator shelf 44 so that the platen can expand or contract in response to its changing temperature without excessive mechanical stress between the platen and the shelf. If a vacuum exists within the chamber during such time periods, the air pressure in the actuator chamber should be sufficient to prevent the platen from being pushed away from the insulator shelf in response to atmospheric pressure on the lower actuator plate 64.

An alternative pneumatic actuator design which avoids the need for an air pump would be to design the relative dimensions of the pressure actuator 60 and the pedestal 54 so that the air inside the chamber 70 of the pressure actuator is under compression when the pressure actuator is mounted in the process chamber 8. Specifically, with the actuator 60 in its relaxed state in which the air in the actuator chamber 70 is at atmospheric pressure, the spacing (L1) between the upper and lower annular plates should exceed by a predetermined length ($\Delta L$) the distance (L2) by which the lower shoulder 76 of the pedestal extends below the flange 58 in the process chamber rear cover 52. When the actuator is fastened to the pedestal by tightening nut 74, the actuator will be compressed by the amount of this predetermined length ($\Delta L$), so that the spacing between the upper and lower annular plates will be L2=L1−$\Delta L$. Consequently, the pressure of the air within the actuator chamber will be L1/L2 atmospheres. Therefore, instead of using an external air pump to produce the required air pressure in the actuator chamber 70, the length (L2) by which the pedestal lower shoulder 76 extends below the annular flange 58 in the process chamber rear cover 52 and the relaxed spacing (L1) between the two actuator annular plates 62 and 64 can be selected so that their ratio L1/L2 equals the required air pressure.

c. Mechanical Spring Pressure Actuator

FIG. 3 shows a further alternative implementation of the pressure actuator 60' which substitutes a mechanical spring 78 for the bellows 66 and 68 of the FIG. 2 embodiment, so that the downward force on the platen 30 is produced by mechanical spring force instead of pneumatic pressure. Defining L1 as the spacing between the upper and lower annular plates when the spring is relaxed and defining L2 as in the preceding paragraph, then mounting the pressure actuator on the pedestal and tightening nut 74 will compress the axial length of the spring by $\Delta L = L1 - L2$. If the spring is characterized by a linear spring constant, the downward force applied by the spring to the platen will equal the spring constant multiplied by the axial compression ΔL. As in the previously described embodiment in which the actuator is pneumatic, the resultant downward force on the platen equals the spring force applied by the actuator, plus the combined weight of the platen and pedestal, minus an upward force when a vacuum is present in the process chamber. The spring force should be selected to obtain the desired resultant force.

In contrast with the pneumatic pressure actuator 60 of FIG. 2, the mechanical spring pressure actuator 60' of FIG. 3 lacks the capability of being controlled to reduce the force on the platen while the platen is heating up or cooling down. In fact, the mechanical spring actuator 60' has the further disadvantage of applying a greater resultant force on the platen when the chamber interior is at atmospheric pressure than when the chamber is at a vacuum. Therefore, to minimize thermal stress between the platen and the insulator shelf, a vacuum should be maintained in the chamber during cooling down of the platen before maintenance and during heating up of the platen after maintenance.

FIG. 3 also illustrates the lower annular plate 64 of the pressure actuator 60' being fastened against the lower shoulder 76 of the pedestal 54 by two or more circumferentially spaced bolts 77 instead of the nut 74 used in the FIG. 2 embodiment. Either of the two types of fasteners (bolts 77 or nuts 74) is suitable for mounting either the pneumatic pressure actuator 60 shown in FIG. 2 or the mechanical spring pressure actuator 60' shown in FIG. 3.

FIG. 3 further illustrates that the pressure actuator's upper and lower annular plates 62 and 64 need not be flat.

d. Summary of Pressure Actuator Designs

In summary, each of the described embodiments shares the following design principle. During any processing of a semiconductor wafer, the pressure actuator 60 or 60' should be designed to apply a force between the pedestal 54 and the chamber's rear cover 52 such that the resultant downward force on the platen 30 against the insulator shelf 44 is sufficient to prevent rotation or other inadvertent movement of the platen. Preferably, however, the pressure applied should be low enough that friction between the platen and the underlying surface of the inner shield assembly is low enough to permit the platen to expand and contract radially in response to the range of temperature changes to which the platen will be exposed during semiconductor wafer processing. Consequently, differential thermal expansion between the platen and the shield can be accommodated by the platen sliding across the front surface of the shield, thereby minimizing mechanical stresses between the platen and the shield.

The following Sections 3–5 of this patent specification describe in more detail three alternative embodiments of the insulator shelf 44 which supports the platen. Section 3 describes the embodiment of FIG. 2 in which the lower surface of the platen rests on the upper surface of the insulator shelf, and the shelf is mounted to the chamber wall only at the periphery of the shelf. Section 4 describes the FIG. 3 embodiment in which the lower surface of the shelf rests on the rear cover of the chamber. Section 5 describes the FIG. 4 embodiment in which the insulator shelf is a ring between a peripheral flange of the platen and the chamber wall.

3. Platen-Support Shelf With Periphery Mounted on Chamber Wall

FIG. 2 shows a first embodiment of an insulator shelf 44 for supporting the platen 30. In this embodiment, only the perimeter of the lower surface of the shelf 44 rests on the rear (i.e., lower) cover 52 of the chamber and on the rear wall 50 of the chamber. The entire lower surface of the platen rests on the upper surface of the shelf 44, thereby providing structural support and stability to the platen.

Because only the perimeter of the shelf lower surface contacts the rear cover 52, heat transfer from the platen through the insulator shelf to the chamber wall is much less than if the entire lower surface of the shelf were to rest on the rear cover or on the rear chamber wall. To further reduce heat transfer through the insulator shelf, the remaining, central portion of the shelf 44 is spaced away from the rear cover 52.

To minimize thermal stress in the shelf 44, the shelf preferably is constructed by stacking a number of layers—four layers in the illustrated preferred embodiment—of annular insulator plates 44a, 44b, 44c, 44d. The lowermost insulator plate 44a is bolted to the rear cover 52 and the rear wall 50 of the chamber by a number of circumferentially spaced bolts 55. Each of the remaining layers 44b, 44c, and 44d simply rests on the next lower layer. The platen 30 simply rests on the uppermost layer 44d of the insulator shelf.

During operation of the process chamber 8, our novel pressure actuator 60, described earlier, presses together the platen 30 and the layers 44a–44d of the insulator shelf with sufficient pressure to stabilize the platen and resist inadvertent movement of the platen. However, the pressure applied by the actuator 60 preferably should be low enough to permit differential radial expansion between each adjacent pair of layers 44a–44d, and between the platen and the topmost layer 44d. The temperature of each successive layer 44a, 44b, 44c, and 44d is higher than the layer on which it rests. Therefore, the pressure actuator 60 should be adjusted to apply a pressure low enough to permit each layer 44a–44d to thermally expand by a different amount so as to reduce thermally-induced mechanical stress between the layers, and to reduce stress between the platen and the topmost layer 44d.

As described earlier, the pressure applied by the pneumatic actuator 60 of FIG. 2 can be adjusted by adjusting the gas pressure supplied by the pump 82. Alternatively, the spring actuator 60' of FIG. 3 can be substituted for the pneumatic actuator 60 of FIG. 2, in which case the pressure can be adjusted by selecting the spring coefficient of the spring 78.

Each annular insulator plate preferably includes at least one narrow, annular, axially-extending projection which serves to separate the upper and lower surfaces of adjacent plates in the stack, thereby minimizing heat transfer between the adjacent plates. For example, the projection can be an annular ridge near the perimeter of each insulator plate.

A beneficial function of the pressure actuator 60 is to press together the platen and the layers 44a–44d of the insulator shelf to minimize or eliminate gaps through which the process gas in the chamber can enter, thereby reducing or eliminating the need to periodically clean deposits from these components. By employing the pressure actuator to clamp these components together instead of mounting them in fixed positions, the gaps between them can be minimized while still accommodating differential thermal expansion among the clamped components.

Some process chambers pressurize the region 46 behind the platen with a non-reactive "purge" gas at a pressure slightly higher than the pressure in the central region 40 of the vacuum chamber in order to inhibit the diffusion of process gas behind the platen. Our design as described in the two preceding paragraphs often will overcome the need for such "purge" gas.

A cylindrical dielectric outer shield 48 encircles the platen and insulator shelf 44 to protect them from exposure to the process gas mixture and to prevent arcing or other electrical discharge between the chamber enclosure 10 and the platen.

Vacuum chambers generally employ O-rings to seal the internal vacuum against atmospheric pressure outside the chamber. Many conventional vacuum chambers for semiconductor processing employ O-rings which are expensive because they are large in diameter and must withstand temperatures of hundreds of degrees Celsius. O-rings are much cheaper if they are small in diameter, or if are kept cool so that they need not be constructed of expensive, high temperature materials.

Advantageously, the FIG. 2 embodiment does not require any expensive O-rings, by which we mean O-rings of large diameter which must withstand high temperatures. Specifically, the only large diameter O-ring is O-ring 51, which provides a vacuum seal between the periphery of the rear cover 52 and the rear wall 50 of the process chamber. O-ring 51 is in direct thermal contact with the chamber enclosure 10, hence remains relatively cool (typically no hotter than 100° C.) because the chamber enclosure 10, being aluminum, is a good heat conductor. Therefore, O-ring 51 can be manufactured of inexpensive materials not intended for high temperature operation.

O-rings 59, 73 and 75 provide a vacuum seal where the pedestal or post 54 extends through the aperture in the rear cover 52. O-rings 73 and 75 will be exposed to higher temperatures than O-ring 51 because they contact the lower end of the post 54, which directly contacts the hot platen 30. O-ring 59 will be somewhat less hot, because the dielectric flange 58 provides partial thermal insulation between the O-ring 59 and the post 54. Because these three O-rings 59, 73 and 75 are of relatively small diameter, they are not expensive even if they are manufactured of materials capable of withstanding high temperatures.

Because no O-rings are employed between the central region 40 of the process chamber and the region 46 behind the platen, the latter region must be evacuated of air to prevent such air from contaminating the process gases in the process chamber. Accordingly, a vacuum line extends from an external vacuum pump to a fitting (not shown) in the rear cover 52, and the pump maintains a vacuum in the region 46 behind the platen whenever a semiconductor wafer is being processed in the process chamber. This pump can be the same vacuum pump which maintains vacuum within the central region 40 of the process chamber.

To reduce heat transfer from the post 54 to the chamber wall 10, the rear cover 52 has an outer rim 53 which is very thin to minimize its thermal conductivity, and which is spaced away from the rear wall 50 of the chamber.

In applications not requiring the platen 30 to be electrically insulated from the chamber wall 10, the material of which the platen-support shelf 44 is fabricated need not be an electrical dielectric, although preferably it should be a good thermal insulator to minimize heat transfer from the platen to the chamber wall.

In the embodiment of FIG. 2, the chamber 8 has a rear cover 52 which is removable to facilitate maintenance of the chamber components. However, the invention is equally applicable to a chamber not having a removable rear (or lower) cover, in which case the pressure actuator 60 or 60' could be mounted on the chamber wall 10 (preferably on the rear portion 50 of the chamber wall) instead of being mounted on the rear cover 52.

4. Platen Resting on Rear Cover

FIG. 3 shows an alternative design for a platen-support shelf which we currently consider preferable to the design shown in FIG. 2. In the design of FIG. 3, the chamber's rear cover 52', in combination with annular dielectric spacer 102, functions as the platen-support insulator shelf. Specifically, the front (upper) surface of the rear cover 52' supports the weight of the platen 30, and the pressure actuator 60' presses the platen and rear cover together. The region below the rear cover 52' is exposed to ambient atmosphere.

A preferred material for the rear cover 52' is stainless steel, because it is a good thermal insulator and mechanically strong.

As shown in FIG. 3, the platen-support insulator shelf may further include a thermal insulator plate 44' between the platen and the rear cover, for the purpose of reducing heat transfer from the platen to the rear cover. It need not be an electrical dielectric, although most good thermal insulators also are good electrical insulators.

The rear cover 52' and dielectric spacer 102 are rigidly attached to the lower wall of the chamber by a plurality of circumferentially spaced bolts 55. The thermal insulator plate 44' simply rests on the rear cover, and the platen 30 simply rests on the thermal insulator plate. As in the previously described design of FIG. 2, the pressure actuator 60' preferably is adjusted to press the platen and rear cover together with a pressure high enough to prevent inadvertent movement of the platen, but low enough to permit the platen, thermal insulator plate, and rear cover to exhibit different amounts of thermal expansion, thereby minimizing mechanical stress due to temperature differentials among these three components.

A beneficial function of the pressure actuator 60' is to press together the platen 30, the thermal insulator plate 44', and the rear cover 52' to minimize or eliminate gaps through which the process gas in the chamber can enter, thereby reducing or eliminating the need to periodically clean deposits from these components. By employing the pressure actuator to clamp these components together instead of mounting them in fixed positions, the gaps between them can be minimized while still accommodating differential thermal expansion among the clamped components.

The pressure actuator 60' operates as described earlier, and it can be implemented by any of the alternative pressure actuator designs described earlier. FIG. 3 illustrates the previously described implementation of the pressure actuator using a mechanical spring 78 instead of the bellows 66 and 68 of the pneumatic implementation shown in FIG. 2.

In the FIG. 3 embodiment, unlike the FIG. 2 embodiment discussed previously, the rear cover 52' is electrically connected to the platen 30 rather than to the chamber wall 10; that is, the rear cover is electrically "hot". Consequently, unlike the FIG. 2 design, an annular dielectric spacer 102 is provided between the rear cover 52' and the process chamber rear wall 50 to electrically insulate the rear cover from the chamber wall. Also, each bolt 55 is surrounded by a dielectric sleeve 114 and a dielectric washer 115 to insulate the bolt from the chamber wall.

The primary reason we found it advantageous to electrically connect the rear cover 52' to the platen 30 rather than to the chamber wall is to facilitate the mounting onto the rear cover of the bellows assembly 110 which supports the wafer lift pins 112. The lift pins extend through narrow holes in the platen. Maintaining the lift pins at approximately the same RF voltage as the platen eliminates any need for dielectric sleeves to electrically insulate the lift pins from the platen.

The FIG. 3 design employs two O-rings 104 and 106 to provide a vacuum seal between the process chamber interior and the ambient atmosphere, in contrast with the single O-ring 51 which performs this function in the FIG. 2 design. As shown in FIG. 3, the first O-ring 104 provides a vacuum seal between the rear cover 52 and the dielectric spacer 102, and the second O-ring 106 provides a vacuum seal between the dielectric spacer 102 and the rear wall 50 of the process chamber.

Like the large O-ring 51 of the FIG. 2 design, the second O-ring 106 in FIG. 3 remains relatively cool because it contacts the chamber enclosure 10, hence it advantageously can be fabricated of inexpensive material not intended for high temperature operation. However, the first O-ring 104 is isolated from the chamber enclosure by the dielectric spacer 102, and it is in good thermal contact with the hot pedestal 54.

To keep the first O-ring cool enough to avoid the need for expensive high temperature O-ring materials, the rear cover 52' includes a number of ribs 108. The ribs increase the surface area of the rear cover which is exposed to the ambient air, so that heat conducted from the platen to the rear cover will be transferred to the air.

Because stainless steel is such a good thermal insulator (better than most ceramics), we have calculated that the ribbed stainless steel rear cover 52' shown in FIG. 3 creates a sufficient temperature drop from the platen 30 to the first O-ring 104 so the additional thermal insulation contributed by the thermal insulator plate 44' is unnecessary. Therefore, the thermal insulator plate 44' can be completely omitted. In our currently preferred implementation, the platen 30 rests directly on the top surface of the rear cover 52', without any intermediate thermal insulator plate 44'.

When the FIG. 3 design is implemented in a semiconductor process chamber having a 12-inch platen 30 heated to about 450° C., we estimate the maximum temperatures of the first and second O-rings 104 and 106 will be no more than 160° C. and 100° C., respectively.

To further cool the rear cover, it may be desirable to circulate the air behind the platen so that air heated by the rear cover will not remain stagnant.

In applications not requiring the platen 30 to be electrically insulated from the chamber wall, one can eliminate the annular dielectric spacer 102, dielectric sleeves 114, dielectric washers 115, and one of the first and second O-rings 104, 106.

A cylindrical dielectric outer shield 48 encircles the platen and the inner shield 44' to protect them from exposure to process gas reactive species and to prevent arcing or other electrical discharge between the chamber enclosure 10 and either the platen or the rear cover 52'.

5. Ring-Shaped Platen-Support Insulator Shelf

FIG. 4 shows an alternative embodiment of the invention in which the platen-support insulator shelf is a ring 120 of insulator material between the platen 30' and the chamber wall 10.

In this embodiment, the platen could be a simple disc 30 as in the previously discussed embodiment of FIG. 3. More preferably, the aluminum platen 30' includes a thin flange 122 extending axially rearward (i.e., downward) from the perimeter of the platen, with the flange terminating in a lip 32 which rests on the insulator ring 120. The thinness of the flange 122 beneficially reduces heat transfer from the platen to the insulator ring. In other words, the flange 122 in the FIG. 4 embodiment performs the thermal insulation function of the multiple layers 44a–44d in the FIG. 2 embodiment, although the aluminum flange 122 clearly is a less effective thermal insulator than the multiple layers 44a–44d.

The pressure actuator 60 operates in the same manner and performs the same functions as explained earlier in the description of the FIG. 2 embodiment. Any of the alternative embodiments 60 or 60' of a pressure actuator can be used.

O-ring 51 between the rear cover 52 and the chamber wall 10 provides a vacuum seal between the chamber interior and the external atmosphere. As in the FIG. 2 embodiment, this O-ring remains relatively cool because it directly contacts the chamber wall.

6. Outer Dielectric Shield

Each of the previously described embodiments of the invention preferably includes a dielectric outer shield 48 surrounding the periphery of the platen 30. One purpose of the outer shield 48 is to prevent arcing or other electrical discharge between the perimeter of the platen and nearby surfaces of the chamber wall. Another purpose of the outer shield 48 is to surround the components of the platen-support insulator shelf to further reduce diffusion of process gas into any small gaps between the components of the shelf or between the shelf and the platen.

The inner shield assembly 44 and outer shield 48 adjoin the platen peripheral flange 32 along angular contours which impede the diffusion of process gas molecules and ions into the region 46 behind the platen.

What is claimed is:

1. Apparatus for processing a semiconductor workpiece, comprising:

a vacuum chamber having a wall;

a platform-support shelf attached to the wall of the chamber;

a workpiece support platform positioned inside the chamber, the platform having a first surface adapted for receiving a semiconductor workpiece and having a second surface abutting the platform-support shelf; and a pressure actuator mounted to both the shelf and the platform so as apply compressive pressure between the shelf and the second surface of the platform.

2. Apparatus according to claim 1, wherein the first and second surfaces are front and rear faces, respectively, of the platform.

3. Apparatus according to claim 1, wherein the shelf is composed of a material which provides thermal insulation between the platform and the chamber wall.

4. Apparatus according to claim 1, wherein the shelf is composed of a material which provides electrical insulation between the platform and the chamber wall.

5. Apparatus according to claim 1, wherein the pressure actuator includes a spring connected to the shelf and the platform to apply said compressive pressure between the shelf and the platform.

6. Apparatus according to claim 1, wherein the pressure actuator includes a pneumatic piston connected to the shelf and the platform to apply said compressive pressure between the shelf and the platform.

7. Apparatus according to claim 6, further comprising:

a source of pressurized gas; and a valve, connected between the gas source and the pneumatic piston, for controlling whether the pressurized gas is applied to the pneumatic piston;

wherein the pneumatic piston applies said compressive pressure between the shelf and the platform only when it receives pressurized gas through the valve.

8. Apparatus for processing a semiconductor workpiece, comprising:

a vacuum chamber having a wall;

a platform-support shelf attached to the wall of the chamber;

a workpiece support platform positioned inside the chamber, the platform having a first surface adapted for receiving a semiconductor workpiece and having a second surface abutting the platform-support shelf;

a pressure actuator mounted to both the shelf and the platform so as apply compressive pressure between the shelf and the second surface of the platform; and a controller for controlling the pressure actuator to apply said compressive pressure during at least one time period when the temperature of the platform is stable during processing of a semiconductor workpiece, and for controlling the pressure actuator to discontinue the application of said compressive pressure during at least a second time period when the temperature of the platform is changing.

9. Apparatus according to claim 6, further comprising:

a source of pressurized gas; and a pressure regulator, connected between the gas source and the pneumatic piston, for controlling the gas pressure applied to the pneumatic piston;

wherein the pneumatic piston applies said compressive pressure between the shelf and the platform in proportion to the gas pressure applied to the piston.

10. Apparatus according to claim 9, wherein the pressure regulator is adjusted to apply a pressure between the shelf and the platform which is high enough to inhibit inadvertent movement of the platform, yet low enough to accommodate differential thermal expansion between the platform and the shelf by permitting the platform to slide across the abutting surface of the shelf.

11. Apparatus for processing a semiconductor workpiece, comprising:

a vacuum chamber having a wall;

a platform-support shelf attached to the wall of the chamber;

a workpiece support platform positioned inside the chamber, the platform having a first surface adapted for receiving a semiconductor workpiece and having a second surface abutting the platform-support shelf; and a pressure actuator mounted to both the shelf and the platform so as apply compressive pressure between the shelf and the second surface of the platform;

wherein the pressure actuator is adjusted to apply a pressure between the shelf and the platform which is high enough to inhibit inadvertent movement of the platform, yet low enough to accommodate differential thermal expansion between the platform and the shelf by permitting the platform to slide across the abutting surface of the shelf.

12. Apparatus for supporting a semiconductor workpiece according to claim 1, wherein:

the pressure actuator includes first and second end members, wherein the pressure applied by the pressure actuator is expansive pressure between the two end members, and wherein the first end member is attached to the shelf;

the shelf includes a hole extending through the shelf; and the apparatus for supporting a semiconductor workpiece further includes a post having first and second ends, the post extending through the hole in the shelf so that the first and second ends are at opposite sides of the hole, the first end of the post being attached to the platform, and the second end of the post being attached to the second end member of the pressure actuator;

wherein expansive pressure applied by the pressure actuator between the two end members produces compressive pressure between the shelf and the platform.

13. Apparatus according to claim 12, wherein the pressure actuator further includes a spring having opposite ends respectively attached to the first and second end members of the pressure actuator.

14. Apparatus according to claim 12, wherein the pressure actuator further includes a pneumatic pressure chamber having opposite ends respectively attached to the first and second end members of the pressure actuator.

15. Apparatus according to claim 1, wherein the workpiece support platform is not rigidly attached to either the wall or the platform-support shelf.

16. Apparatus according to claim 15, wherein the pressure actuator applies a pressure between the shelf and the platform that is high enough to inhibit inadvertent movement of the platform, yet that is low enough to accommodate differential thermal expansion between the platform and the shelf by permitting the platform to slide across the abutting surface of the shelf.

17. Apparatus for processing a semiconductor workpiece, comprising:

a vacuum chamber having a wall;

a platform-support shelf attached to the wall of the chamber;

a workpiece support platform positioned inside the chamber, the platform having a first surface adapted for receiving a semiconductor workpiece and having a second surface abutting the platform-support shelf; and a pressure actuator mounted to both the shelf and the platform so as apply compressive pressure between the shelf and the second surface of the platform without the pressure actuator applying any pressure to the semiconductor workpiece.

18. Apparatus for processing a semiconductor workpiece, comprising:

a vacuum chamber having a wall;

a platform-support shelf attached to the wall of the chamber;

a workpiece support platform positioned inside the chamber, the platform having a first surface adapted for receiving a semiconductor workpiece and having a second surface abutting the platform-support shelf; and a pressure actuator mounted to both the shelf and the platform so as apply compressive pressure between the shelf and the second surface of the platform without the pressure actuator applying any pressure to the first surface of the platform.

19. A method of processing a semiconductor workpiece inside a semiconductor process vacuum chamber, comprising the steps of:

providing a vacuum chamber having a wall;

providing a platform-support shelf inside the chamber;

attaching the shelf to the wall of the chamber;

positioning inside the chamber a workpiece support platform having first and second surfaces, so that the second surface of the platform is positioned abutting the shelf;

applying compressive pressure between the shelf and the second surface of the platform; and mounting a semiconductor workpiece adjacent the first surface of the workpiece support platform.

20. A method according to claim 19, wherein the first and second surfaces are front and rear faces, respectively, of the platform.

21. A method according to claim 19, wherein step of providing said shelf further comprises:

composing said shelf of a material which provides thermal insulation between the platform and the chamber wall.

22. A method according to claim 19, wherein step of providing said shelf further comprises:

providing in said shelf a material which provides electrical insulation between the platform and the chamber wall.

23. A method according to claim 19, wherein the step of applying pressure further comprises:

mounting a spring between the shelf and the platform so as to apply said compressive pressure between the shelf and the platform.

24. A method according to claim 19, wherein the step of applying pressure further comprises:

mounting a pneumatic piston between the shelf and the platform so as to apply said compressive pressure between the shelf and the platform.

25. A method according to claim 16, further comprising the step of:

controllably connecting and disconnecting gas pressure to the pneumatic piston so as to control whether said compressive pressure is applied between the shelf and the platform.

26. A method of processing a semiconductor workpiece inside a semiconductor process vacuum chamber, comprising the steps of:

providing a vacuum chamber having a wall;

providing a platform-support shelf inside the chamber;

attaching the shelf to the wall of the chamber;

positioning inside the chamber a workpiece support platform having first and second surfaces, so that the second surface of the platform is positioned abutting the shelf;

mounting a semiconductor workpiece adjacent the first surface of the workpiece support platform;

applying compressive pressure between the shelf and the second surface of the platform during at least one time period when the temperature of the platform is stable during processing of the semiconductor workpiece; and discontinuing said compressive pressure during at least a second time period when the temperature of the platform is changing.

27. A method of processing a semiconductor workpiece inside a semiconductor process vacuum chamber, comprising the steps of:

providing a vacuum chamber having a wall;

providing a platform-support shelf inside the chamber;

attaching the shelf to the wall of the chamber;

positioning inside the chamber a workpiece support platform having first and second surfaces, so that the second surface of the platform is positioned abutting the shelf;

mounting a semiconductor workpiece adjacent the first surface of the workpiece support platform;

applying compressive pressure between the shelf and the second surface of the platform; and adjusting said pressure between the shelf and the second surface of the platform so that the pressure is high enough to inhibit inadvertent movement of the platform, yet low enough to accommodate differential thermal expansion between the platform and the shelf by permitting the platform to slide across the abutting surface of the shelf.

28. A method according to claim 19, further comprising the steps of:

forming a hole extending through the shelf;

providing a post having first and second ends;

positioning the post so that a central portion of the post extends through the hole in the shelf and so that the first and second ends of the post are at opposite sides of the hole; and attaching the first end of the post to the platform;

wherein the step of applying compressive pressure between the shelf and the platform comprises applying expansive pressure between the shelf and the second end of the post.

29. A method according to claim 28, wherein the step of applying expansive pressure between the shelf and the second end of the post comprises:

connecting a spring between the shelf and the second end of the post.

30. A method according to claim 28, wherein the step of applying expansive pressure between the shelf and the second end of the post comprises:

connecting a pneumatic piston between the shelf and the second end of the post.

31. A method of processing a semiconductor workpiece inside a semiconductor process vacuum chamber, comprising the steps of:

providing a vacuum chamber having a wall;

providing a platform-support shelf inside the chamber;

attaching the shelf to the wall of the chamber;

positioning inside the chamber a workpiece support platform having first and second surfaces, so that the second surface of the platform is positioned abutting the shelf;

mounting a semiconductor workpiece adjacent the first surface of the workpiece support platform; and applying compressive pressure between the shelf and the second surface of the platform without applying any of said pressure to the semiconductor workpiece.

32. A method of processing a semiconductor workpiece inside a semiconductor process vacuum chamber, comprising the steps of:

providing a vacuum chamber having a wall;

providing a platform-support shelf inside the chamber;

attaching the shelf to the wall of the chamber;

positioning inside the chamber a workpiece support platform having first and second surfaces, so that the second surface of the platform is positioned abutting the shelf;

mounting a semiconductor workpiece adjacent the first surface of the workpiece support platform; and applying compressive pressure between the shelf and the second surface of the platform without applying any of said pressure to the first surface of the platform.

* * * * *

UNITED STATES PATENT AND TRADEMARK OFFICE
CERTIFICATE OF CORRECTION

PATENT NO : 6,120,608
DATED : Sep. 19, 2000
INVENTOR(S): Shendon et al.

It is certified that error appears in the above-identified patent and that said Letters Patent is hereby corrected as shown below:

On the Title Page

The filing date should be changed from "Mar. 13, 1997" to: --Mar. 12, 1997--

Signed and Sealed this

Fifteenth Day of May, 2001

*Attest:*

NICHOLAS P. GODICI

*Attesting Officer*  *Acting Director of the United States Patent and Trademark Office*